United States Patent
Wanke et al.

(10) Patent No.: US 10,020,634 B2
(45) Date of Patent: Jul. 10, 2018

(54) MONOLITHICALLY INTEGRATED INFRARED TRANSCEIVER

(71) Applicant: National Technology & Engineering Solutions of Sandia, LLC, Albuquerque, NM (US)

(72) Inventors: Michael Wanke, Albuquerque, NM (US); Christopher Nordquist, Albuquerque, NM (US); Mark Lee, Plano, TX (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 818 days.

(21) Appl. No.: 14/575,430

(22) Filed: Dec. 18, 2014

(65) Prior Publication Data

US 2017/0302054 A1 Oct. 19, 2017

Related U.S. Application Data

(60) Provisional application No. 61/923,914, filed on Jan. 6, 2014.

(51) Int. Cl.
| | |
|---|---|
| *H01S 5/02* | (2006.01) |
| *H01S 5/026* | (2006.01) |
| *H01S 5/20* | (2006.01) |
| *H01S 5/06* | (2006.01) |
| *H01S 5/34* | (2006.01) |
| *H01S 5/343* | (2006.01) |
| *H01S 5/22* | (2006.01) |
| *H01S 5/40* | (2006.01) |

(52) U.S. Cl.
CPC .......... *H01S 5/0261* (2013.01); *H01S 5/0604* (2013.01); *H01S 5/2054* (2013.01); *H01S 5/22* (2013.01); *H01S 5/3401* (2013.01); *H01S 5/343* (2013.01); *H01S 5/4025* (2013.01); *H01S 2301/17* (2013.01)

(58) Field of Classification Search
CPC ...................................................... H01S 5/0261
See application file for complete search history.

(56) References Cited

U.S. PATENT DOCUMENTS

| | | | |
|---|---|---|---|
| 6,055,257 A * | 4/2000 | Baillargeon | ........... B82Y 20/00 372/46.01 |
| 7,550,734 B1 | 6/2009 | Lee et al. | |
| 8,274,058 B1 | 9/2012 | Wanke et al. | |

(Continued)

OTHER PUBLICATIONS

Wanke, M.C. et al., "Monolithically integrated solid-state terahertz transceivers", Nature Photonics, 2010, pp. 565-569, vol. 4.

(Continued)

*Primary Examiner* — David Porta
*Assistant Examiner* — Hugh H Maupin
(74) *Attorney, Agent, or Firm* — Kevin W. Bieg

(57) ABSTRACT

A Schottky diode is monolithically integrated into the core of an infrared semiconductor laser (e.g., a quantum cascade laser) to create a heterodyned infrared transceiver. The internal mode field of the infrared semiconductor laser couples to an embedded Schottky diode and can mix the infrared fields to generate a response at the difference frequency.

20 Claims, 14 Drawing Sheets

(56) References Cited

U.S. PATENT DOCUMENTS

2013/0063159 A1* 3/2013 Koyama ............ G02B 6/1226
324/639

OTHER PUBLICATIONS

Hubers, H.-W. et al., "Video detection and mixing performance of GaAs Schottky-barrier diodes at 30 THz and comparison with metal-insulator-metal diodes", Journal of Applied Physics, 1994, pp. 4243-4248, vol. 75.
Chepurov, S.V. et al., "Experimental investigation of Schottky barrier diodes as nonlinear elements in 800-nm-wavelength region", Applied Physics B, 2004, pp. 33-38, vol. 79.
Weiss, C.O., "Frequency Measurement Chain to 30 THz Using FIR Schottky Diodes and a Submillimeter Backward Wave Oscillator", Applied Physics B, 1984, pp. 63-67, vol. 34.
Moretti, A. et al., "A W-InSb point contact diode for harmonic generation and mixing in the visible", Review of Scientific Instruments, 2000, pp. 585-586, vol. 71.
Champlin, K. S. et al., "Cutoff Frequency of Submillimeter Schottky-Barrier Diodes", IEEE Transactions on Microwave Theory and Techniques, 1978, pp. 31-34, vol. MTT 26.
Kohler, R. et al., "Terahertz semiconductor-heterostructure laser", Nature, 2002, pp. 156-159, vol. 417.
Crowe, T.W. et al., "GaAs Schottky Diodes for THz Mixing Applications", Proceedings of the IEEE, 1995, pp. 1827-1841, vol. 80.

\* cited by examiner

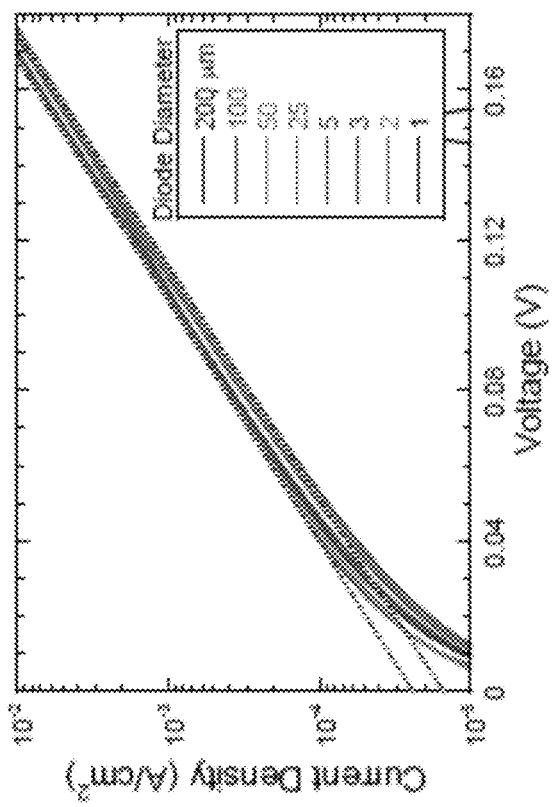
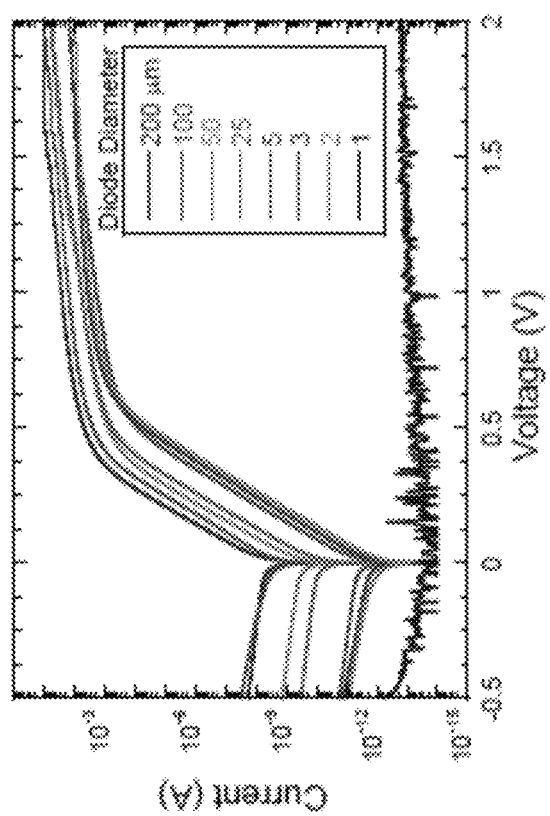
FIG. 9(b)
FIG. 9(a)

MONOLITHICALLY INTEGRATED INFRARED TRANSCEIVER

CROSS-REFERENCE TO RELATED APPLICATION

This application claims the benefit of U.S. Provisional Application No. 61/923,914, filed Jan. 6, 2014, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to photodetectors and, in particular, to a monolithically integrated infrared transceiver.

BACKGROUND OF THE INVENTION

The fundamental challenge faced by all photodetectors in the mid/far-infrared spectral region stems from the need to use a low-energy transition for the photo-absorption in narrow bandgap semiconductors, quantum nanostructures, or low-energy impurity transitions. This inevitably results in high dark current due to thermal excitations, which limits the overall performance of the detector. Dark current is alleviated at low temperatures where commercial and conventional, single-element photocurrent and photovoltaic detectors can provide excellent performance, with detectivities, $D^*$, of about $10^{11}$ cm.Hz$^{1/2}$ W$^{-1}$ for liquid nitrogen cooled detectors. However, the cryogenic cooling requirement limits applications of such systems. Thermoelectric-cooled and room temperature detector elements have much lower detectivities $D^*$ of about $10^9$ cm.Hz$^{1/2}$ W$^{-1}$ and $10^7$ cm.Hz$^{1/2}$ W$^{-1}$, respectively.

Therefore, a need remains for an infrared photodetector that can operate near room temperature with low dark current.

SUMMARY OF THE INVENTION

The present invention is directed to a monolithically integrated infrared transceiver (IRT), comprising an infrared (IR) semiconductor laser, the semiconductor laser comprising a bottom cladding layer, a layered semiconductor heterostructure active region, comprising two or more different semiconductor layers, on the bottom cladding layer, and a top cladding layer, comprising a plurality of doped semiconductor layers, on the active region, thereby providing a laser waveguide between the top and bottom cladding layers for confinement of a mode field of the infrared semiconductor laser therein; and a Schottky diode, comprising a rectifying metal contact recessed into the top cladding layer such that the mode field couples to the depletion region of the diode. The mode field comprises at least one mode having a frequency greater than 10 THz, and preferably less than 300 THz.

Mixing can occur between at least two modes of the mode field to provide an intermediate frequency output signal at the diode. The at least two modes can comprise two or more laser modes, one or more laser modes and externally received infrared radiation, one or more laser modes and infrared radiation generated by non-linear mechanisms in the laser, or one or more laser modes and other frequencies generated by non-linear rectification in the Schottky diode. Alternatively, the diode can rectify a single mode of the laser field to provide a DC electrical response proportional to the laser power.

The IR semiconductor laser preferably comprises a quantum cascade laser (QCL). The layered semiconductor heterostructure can comprise GaAs, AlAs, InAs, GaN, AlN, InN, GaSb, AlSb, InSb or alloys thereof. The doping of the top-most doped semiconductor layers of the top cladding layer is tailored to bring the mode field of the IR semiconductor laser close to the rectifying metal contact of the Schottky diode. Preferably, the rectifying metal contact is recessed into the top cladding layer to contact a semiconductor layer having a doping of less than $1 \times 10^{18}$ cm$^{-3}$, so that the diode operates above the plasma frequency of the semiconductor material. For example, the rectifying metal contact can comprise titanium and can have a cross-sectional dimension of greater than 1 micron. A coplanar RF waveguide or microstrip line can bring off the intermediate frequency output signal from the diode.

To overcome the fundamental barrier encountered by direct photodetection schemes and produce a compact device suitable for sensing applications, the present invention can use heterodyne detection (nonlinear mixing) of infrared radiation by a Schottky diode mixer embedded into the ridge waveguide cavity of an IR semiconductor laser. Therefore, the invention combines the high, room-temperature sensitivity of a nonlinear detection scheme with the compactness and convenience of a monolithically integrated semiconductor device. The resulting IRT is an all-solid state, integrated-circuit subsystem that can emit coherent IR radiation and perform frequency and phase-sensitive heterodyne reception in the infrared. It is a compact, manufacturable system comprising a coherent laser source, an integrated high speed mixer, and a high-frequency (microwave) waveguide that can transport the mixer signals off chip to RF electronics. The basic sub-system can be used for many applications, including but not limited to high data-rate mid-infrared wireless communications, which can penetrate through non-optimal weather conditions better than near-infrared and visible communication links and has higher directionality than microwave signals; point, remote or stand-off sensing of chemicals, biomaterials, and aerosols with high sensitivity and spectral resolution in both passive and active illumination modes; IR tomographic imaging; built-in laser performance monitoring; and creating an absolute frequency comb.

BRIEF DESCRIPTION OF THE DRAWINGS

The detailed description will refer to the following drawings, wherein like elements are referred to by like numbers.

FIG. 9(a) is a graph of forward current and FIG. 9(b) is a graph of the forward current density versus diode bias for diodes with diameters ranging from 1 μm to 200 μm.

DETAILED DESCRIPTION OF THE INVENTION

Heterodyne mixers beat an incoming received frequency against a known local oscillator (LO) frequency to generate an intermediate frequency (IF) difference signal that is tunable through the LO frequency. The LO can have a fixed output power that is generally much greater than the power of the received signal. A nonlinear mixer produces an IF output power that is proportional to the product of the powers of the received signal and the LO signal. Mixers display good rejection of incoherent noise and interference.

The IRT of the present invention integrates onto a single semiconductor chip platform an edge-emitting IR semiconductor laser, preferably a QCL, and a single or a linear array of IR heterodyne mixers. The laser supplies the necessary LO source for the mixer(s) and also, if desired, an active illumination source for the transceiver. Depending on the specific application, there are many types of mixer components, such as Schottky diodes and hot-electron bolometers that can be used. In particular, Schottky diodes comprise a metal-semiconductor junction between a metal anode and an n-type semiconductor, creating a rectifying barrier. The Schottky diode detects incoming infrared signals within a certain frequency range of the LO frequency of the laser and generates a down-converted IF output signal at the RF difference frequency between the LO and the received infrared signal.

Figure 1A:
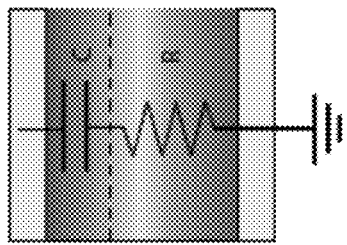
FIG. 1(a) is a simplified diode model representing antenna coupling.
Figure 1B:
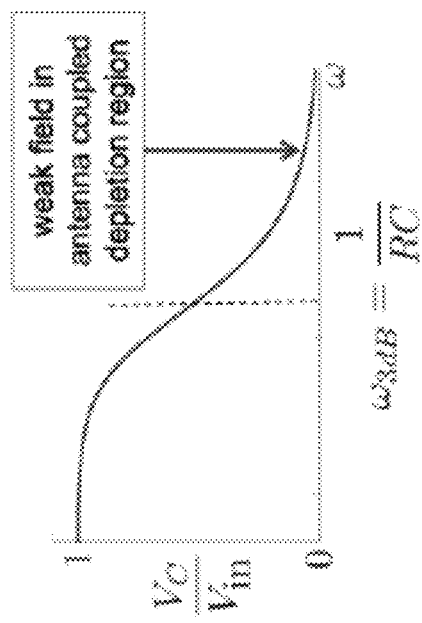
FIG. 1(b) is a graph of the voltage drop over the antenna-coupled depletion region as function of frequency.

Schottky detectors are commonly used as mixers at lower frequencies where they can be integrated with antennas to couple incoming light to the small diode. The goal is to couple as much of the field as possible into the depletion region of the diode to drive the diode non-linearity. Although extremely sensitive at low frequencies, the sensitivity of Schottky diodes at higher frequencies has been limited due to the device capacitance, which shunts higher frequency signals collected by the antenna around the diode. This is because, in the antenna coupling case, shown in FIG. 1(a), the antenna takes the external field and creates a voltage between metal plates (i.e., between the Schottky and Ohmic contacts) and the potential profile between the plates will depend on the relative impedances of the depletion region and the n-doped region of the semiconductor. The depletion region looks like a capacitor and the n-doped region looks like a resistor. As the external frequency increases, the capacitor impedance decreases and less of the potential drop will occur in the depletion region. Therefore, the electric field across the depletion region in an antenna-coupled structure will decrease as the frequency increases above a parasitic cut-off frequency, as shown in FIG. 1(b).

Figure 1C:
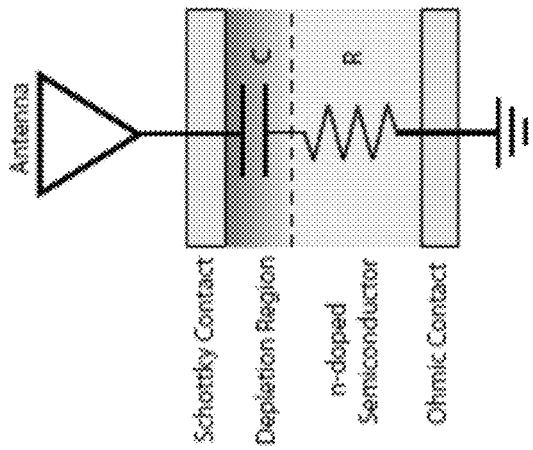
FIG. 1(c) is a simplified diode model representing plasmon coupling.

A Schottky diode embedded in the core of a terahertz (THz) QCL has been demonstrated to respond to the internal laser field such that the monolithically integrated laser and diode act as a heterodyne receiver of external radiation. See M. C. Wanke et al., *Nat. Photonics* 4, 565 (2010), U.S. Pat. No. 7,550,734, and U.S. Pat. No. 8,274,058, which are incorporated herein by reference. This THz transceiver showed a strong diode response when the external radiation was coupled into the laser end facets. If external radiation couples into the facet it will propagate along the laser waveguide and couple to the diode in the same way that the internal laser modes couple to the diode. Therefore, the field of a THz waveguide will be strongly coupled via a surface plasmon to the metal of the Schottky diode and hence a strong field will exist within the depletion region of a diode placed on the same surface, as shown in FIG. 1(c). In THz lasers the waveguide mode is very strong right at the metal-semiconductor interface so there is a large high-frequency field in the depletion region of the diode.

Schottky diode detectors have been demonstrated in the mid-infrared, but only with whisker-contacted diodes in order to achieve a low parasitic capacitance. See H. W. Hubers et al., *J. Appl. Phys.* 75, 4243 (1994); S. V. Chepurov et al., *Appl. Phys. B* 79, 33 (2004); C. O. Weiss, *Appl. Phys. B* 34, 63 (1984); and A. Moretti et al., *Rev. Sci. Instrum.* 71, 585 (2000). However, it has been widely accepted that the RC time constant of planar Schottky diodes limits their use to frequencies of a few THz or below. See K. S. Champlin et al., *IEEE Trans. Microwave Theory and Techniques* 26, (1978). Therefore, there have been many uncertainties about whether a Schottky diode could be integrated with an IR QCL for the following reasons:

For lowest waveguide loss, THz QCLs confine the radiation using metallic waveguides whereas IR QCLs prefer dielectric cladding layers. This leads to very strong coupling of the laser field to the surface plasmon waves in THz QCLs, but weak coupling to these surface plasmon waves in IR QCLs. Thus, the IR QCL waveguide of the present invention balances pulling the laser mode close enough to the surface to increase coupling to the diode against keeping the mode far enough away to maintain low enough waveguide loss to allow lasing to occur.

Moving from THz to IR moves from below to above the bulk plasma frequency of the doped semiconductor layer in the Schottky diode. Although whisker contacted diodes have been demonstrated at IR frequencies, the antenna-less coupling of the IRT of the present invention is different and it was uncertain how the bulk plasma frequency would affect the surface plasmon wave coupling to the diode.

In the THz, the wavelengths are tens of microns, which are much larger than a typical diode, while at the shorter IR wavelengths it is difficult to fabricate an integrated diode with subwavelength dimensions. Further, the phase of the surface plasmon wave varies as a function of position, raising the question of how this affects diode response. This situation is clearly different than that in sub-wavelength antenna-coupled diodes where it is assumed that the field between the anode and cathode is due to the potential difference between the metals comprising the two halves of the antenna.

Besides the waveguide difference for THz and IR QCLs, the preferred laser material is also different. InGaAs/AlInAs on InP lasers are preferred for IR QCLs, especially for room temperature operation and shorter wavelengths. Schottky diodes on these materials have lower barrier heights. Thus, doping levels need to be modified and the impact of barrier height on the sensitivity needs to be considered with the IRT.

Accordingly, the IRT of the present invention uses a planar Schottky diode integrated into the QCL waveguide, wherein the laser mode exists in the depletion region of the diode and responds to infrared fields (e.g., greater than 10 THz, or less than 30 μm wavelength) and, more particularly, to mid-infrared fields (e.g., 10-300 THz, or 30-1 μm wavelength), well above the expected parasitic cut-off frequency. Coupling the laser fields directly into the depletion region of the diode appears to bypass the parasitic losses seen with antenna coupling and allows mid-infrared operation with planar diodes. Integration of the metal/semiconductor interface of the Schottky diode into the core of a QCL laser enables the diode to sample the internal fields of the laser.

Rather than have a QCL simply illuminate a mixer (or mixer array) from its facet output through either free-space or an external waveguide, the heterodyne mixer(s) of the present invention are integrated onto the semiconductor ridge that forms the QCL so that the mixer(s) are directly exposed to a small portion of the internal propagating IR field inside the QCL cavity. This method of delivering LO power to the mixer(s) has several significant advantages, among which are:

1) More Available LO Power. The IR power inside the QCL cavity is higher than what can be output externally from the QCL, giving much more potential LO power to work with. This translates into lower mixer noise and enables larger arrays of mixers.
2) Higher Efficiency/Compactness. There are no external waveguide, diffraction, or radiation losses when coupling LO power to the mixers in this manner. Plus, there is no added complication of building on-chip waveguides or optics to direct the IR radiation to a mixer.
3) Lower QCL Bias Thresholds. If no active illumination by the QCL is required, the QCL facets can be made to have as close to 100% reflectivity as possible. This lowers the DC bias threshold required to operate the QCL. A ring QCL geometry, with no facets and hence no facet losses, can also be used. Even photonic crystal lasers and nano-lasers can be used, enabling large mixer arrays.
4) Better LO Power Control. The LO power delivered to each mixer can be carefully controlled by determining how far to lower the integrated mixer into the IR field of the laser cavity.
5) Natural Linear Detection Array. Since the QCL ridges are bars typically several millimeters long and the mixer components have typically 0.1 mm dimensions, a linear array of mixers can naturally be fabricated along a single QCL. This is very useful for imaging and radar type applications.

However, mostly due to differences between typical IR and THz quantum cascade lasers, the change in frequency requires changes in the laser waveguide, the diode placement, the RF waveguide design and measurement design. Below is described an exemplary IRT that operates at 38 THz (i.e., 8 μm wavelength) and incorporates these changes.

Infrared Quantum Cascade Laser Design

Figure 2A:
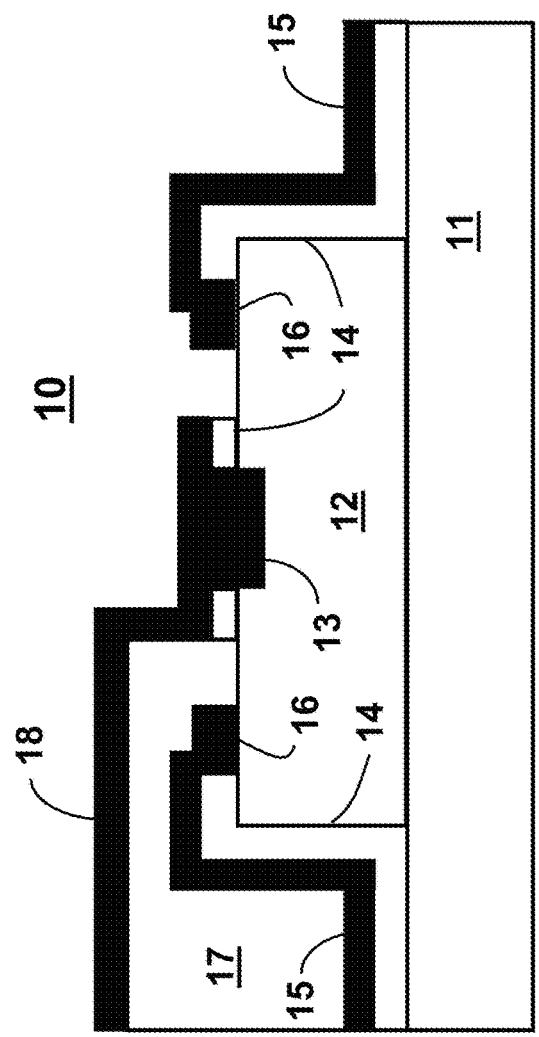
FIG. 2(a) is an end-view schematic illustration of the cross section of an exemplary IRT through the diode and laser.
Figure 2B:
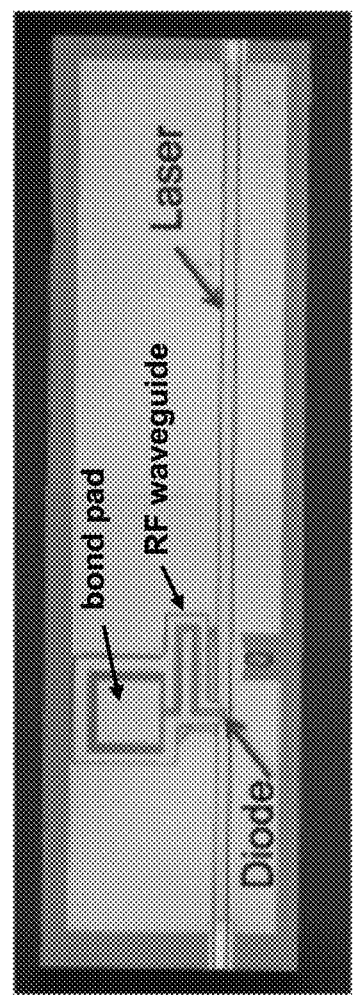
FIG. 2(b) is a top-view photograph of a complete 2 mm long IRT, showing the 25 μm wide laser and the RF waveguide.

A cross-sectional schematic illustration of an IRT 10 comprising an IR semiconductor laser 12 and Schottky diode 13 is shown in FIG. 2(a). An exemplary IR QCL 12 was designed to operate at 8 μm and contained 35 repeats of a layered semiconductor heterostructure active region sandwiched between two cladding regions as described in Tables 1 and 2. The InGaAs/AlInAs growth was done by molecular beam epitaxy (MBE) on a 3" diameter, low-doped (1-4 E17 $cm^{-3}$) n-InP substrate 11. The active region was based on a standard two-phonon resonant, 8 μm QCL design. However, the cladding layers on top of the active region were modified compared to the standard QCL design to shift the internal laser mode profile closer to the top surface and increase the coupling to the diode. Accordingly, the top-most cladding layer was 300 or 500 Å thick with doping of 5-8 E18 $cm^{-3}$ in order to trade laser waveguide loss against diode coupling and be able to achieve reasonable performance for both the laser and diode in a single device. The 2 μm of active region material resided approximately 3 μm below the surface of the top cladding layer. The wafer was wet etched leaving a 25 μm wide ridge waveguide for the laser (processing details are described in the section titled Infrared Transceiver Processing). An insulating $SiO_2$ layer 14 was deposited over the ridge waveguide with an opening created to allow diode contact 13 to the top of the laser 12. A gold layer 15 was deposited on top of the $SiO_2$ 14. This wide area metal pad 15 ran up the sidewalls of the ridge and made contact 16 to the top of the laser 12 while providing a large area bond pad next to the laser. A metal layer (not shown) can be deposited on the backside of the substrate 11 to make contact to the bottom of the laser. A RF waveguide was created on top of the laser top contact 16 comprising a dielectric layer 17 and a gold trace 18 connected to the diode 13 on top of the laser 12. The processed chips were 2 or 3 mm long by 0.5 mm wide. One such integrated 2 mm long chip is shown in FIG. 2(b).

TABLE 1

Layer sequence of the IR QCL.

| | Material | Doping [$cm^{-3}$] | Thickness [Å] |
|---|---|---|---|
| top cladding | GaInAs | 5-8 × $10^{18}$ | 300-500 |
| | GaInAs | 1 · $10^{18}$ | 3000 |
| | $Ga_{0.5x}Al_{0.5(1-x)}InAs$ grading | 2 · $10^{17}$ | 250 |
| | AlInAs | 2 · $10^{17}$ | 8000 |
| | AlInAs | 1 · $10^{17}$ | 15000 |
| | $Ga_{0.5x}Al_{0.5(1-x)}InAs$ grading | 1 · $10^{17}$ | 250 |
| | GaInAs | 5 · $10^{16}$ | 3000 |
| | $Ga_{0.5x}Al_{0.5(1-x)}InAs$ grading | 1 · $10^{17}$ | 139 |
| | Active region | 2 · $10^{17}$ | 597 |

TABLE 1-continued

Layer sequence of the IR QCL.

| | Material | Doping [cm$^{-3}$] | Thickness [Å] |
|---|---|---|---|
| bottom cladding | Ga$_{0.5x}$Al$_{0.5(1-x)}$InAs grading | 1·10$^{17}$ | (repeated 35x) 137 |
| | GaInAs | 5·10$^{16}$ | 5000 |
| | Ga$_{0.5x}$Al$_{0.5(1-x)}$InAs grading | 1·10$^{17}$ | 250 |

TABLE 2

Doping and thickness of the layers in the active region of the IR QCL.

| Material | Doping [cm$^{-3}$] | Thickness [Å] |
|---|---|---|
| GaInAs | | 34 |
| AaInAs | | 14 |
| GaInAs | | 33 |
| AaInAs | | 13 |
| GaInAs | | 32 |
| AaInAs | | 15 |
| GaInAs | 2·10$^{17}$ | 31 |
| AaInAs | 2·10$^{17}$ | 19 |
| GaInAs | 2·10$^{17}$ | 29 |
| AaInAs | 2·10$^{17}$ | 23 |
| GaInAs | | 27 |
| AaInAs | | 25 |
| GaInAs | | 27 |
| AaInAs | | 44 |
| GaInAs | | 18 |
| AaInAs | | 9 |
| GaInAs | | 57 |
| AaInAs | | 11 |
| GaInAs | | 54 |
| AaInAs | | 12 |
| GaInAs | | 45 |
| AaInAs | | 25 |

The purpose of integrating the Schottky diode into the IR QCL is to couple the strong internal laser fields directly into the depletion region of the diode by constructing the laser waveguide to ensure the laser fields are in the depletion region. In a THz QCL, there are no dielectric cladding layers between the laser active region and the top metal laser contact since free carrier absorption in doped cladding layers is much stronger than absorption in the metal. See R. Kohler et al., *Nature* 417, 156 (2002). This leads to very strong electric fields at the metal surface of the THz waveguide and hence very strong electric fields in the depletion region of the diode. However, metal exhibits much more loss in the IR compared to doped semiconductors. Therefore, the IR QCL active region of the present invention is sandwiched between doped cladding layers to confine the laser modes in the cladding. However, because the laser fields are weak at the surface of the cladding layer, a Schottky diode on the top of a standard IR QCL will normally not sense the laser fields.

Figure 3:
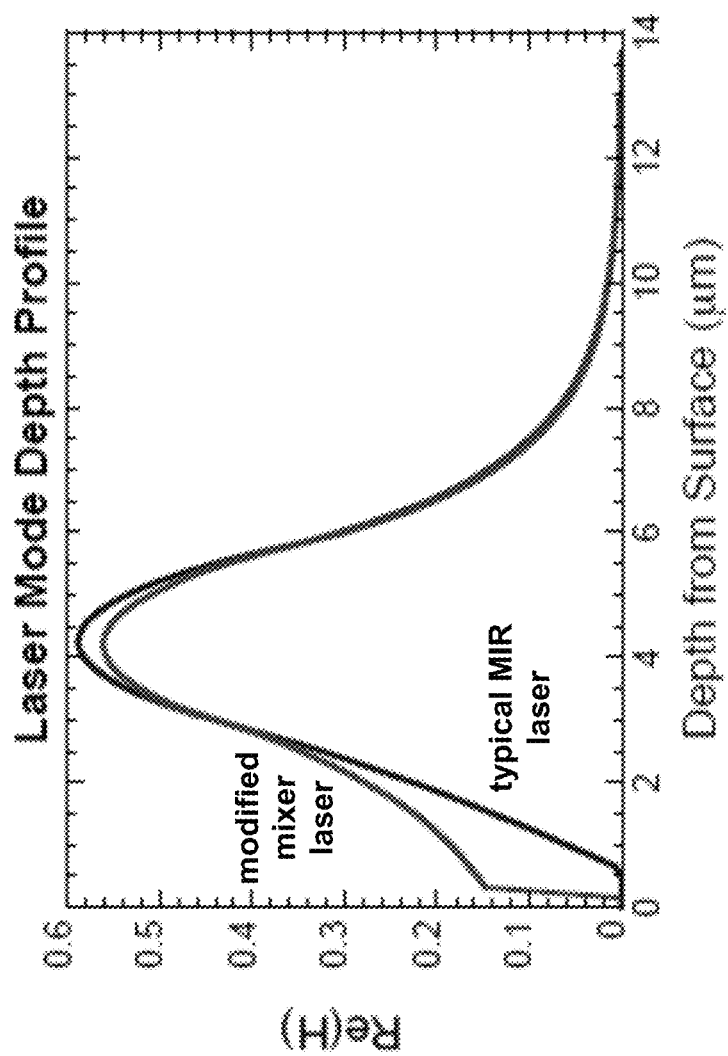
FIG. 3 is a graph of the depth profile of the calculated laser modes for a standard MIR QCL waveguide design and a MIR QCL waveguide modified to bring the laser fields closer to the surface.

Therefore, in order to couple the laser fields to the diode in the IRT of the present invention, the cladding layers were modified to bring the laser modes closer to the top contact of the laser, as shown in FIG. 3 (i.e., the "Typical MIR Laser" has a top-most cladding layer comprising a 100 Å thick, 1E20 doped GaInAs layer on a 3500 Å thick, 8E18 GaInAs layer, and the "Modified Mixer Laser" has a top-most cladding layer comprising a 500 Å thick, 5E18 doped GaInAs layer on a 3000 Å thick, 1E18 GaInAs layer, as shown in Table 1). The modification in the outermost cladding layers nearly doubles the waveguide loss from 7 cm$^{-1}$ to 13 cm$^{-1}$. Although the laser modes were brought closer to the surface, as shown in FIG. 3, the cladding was still designed so that the laser fields were small at the laser top contact to keep the laser waveguide losses from becoming too large. Therefore, in order for the diode to sense the laser fields the diode was further recessed into the top cladding layer to the top of the first AlInAs layer, as described below.

Schottky Diode Design and Placement

At THz frequencies, typical diode design rules suggest that as the frequency increases, the metal anode size should decrease and the doping in the semiconductor near the interface should increase. See, e.g., T. W. Crowe et al., *Proc. IEEE* 80(11), 1827(1992). For few THz frequencies, design rules recommend anode diameters less than 0.5 µm and semiconductor doping levels around 1E18. For the 8 µm radiation used in the exemplary IRT, the IR frequency is about 38 THz. Following the same design rules would indicate nanometer-size anodes and 1E19 doping levels. However, these high doping levels are not an option with the IRT, since doping at these high levels would lead to ohmic contact formation rather than a Schottky barrier (i.e., with increased doping level of the semiconductor the width of the depletion region drops. Below a certain width the charge carriers can tunnel through the depletion region. Therefore, at very high doping levels the junction does not behave as a rectifier anymore and becomes an ohmic contact). Instead, the diode contact was made to the first AlInAs layer with a doping level of 2E17. The diode therefore operated at frequencies above the plasma frequency in the material. The main reason for decreasing the anode area is to reduce junction capacitance so that the fields will couple into the depletion region. Since coupling via internal fields prevents the shunting of the field by the junction capacitance, relatively large diodes, e.g., with diameters of 2 µm to 5 µm, can be used to make the processing more robust.

Figure 4:
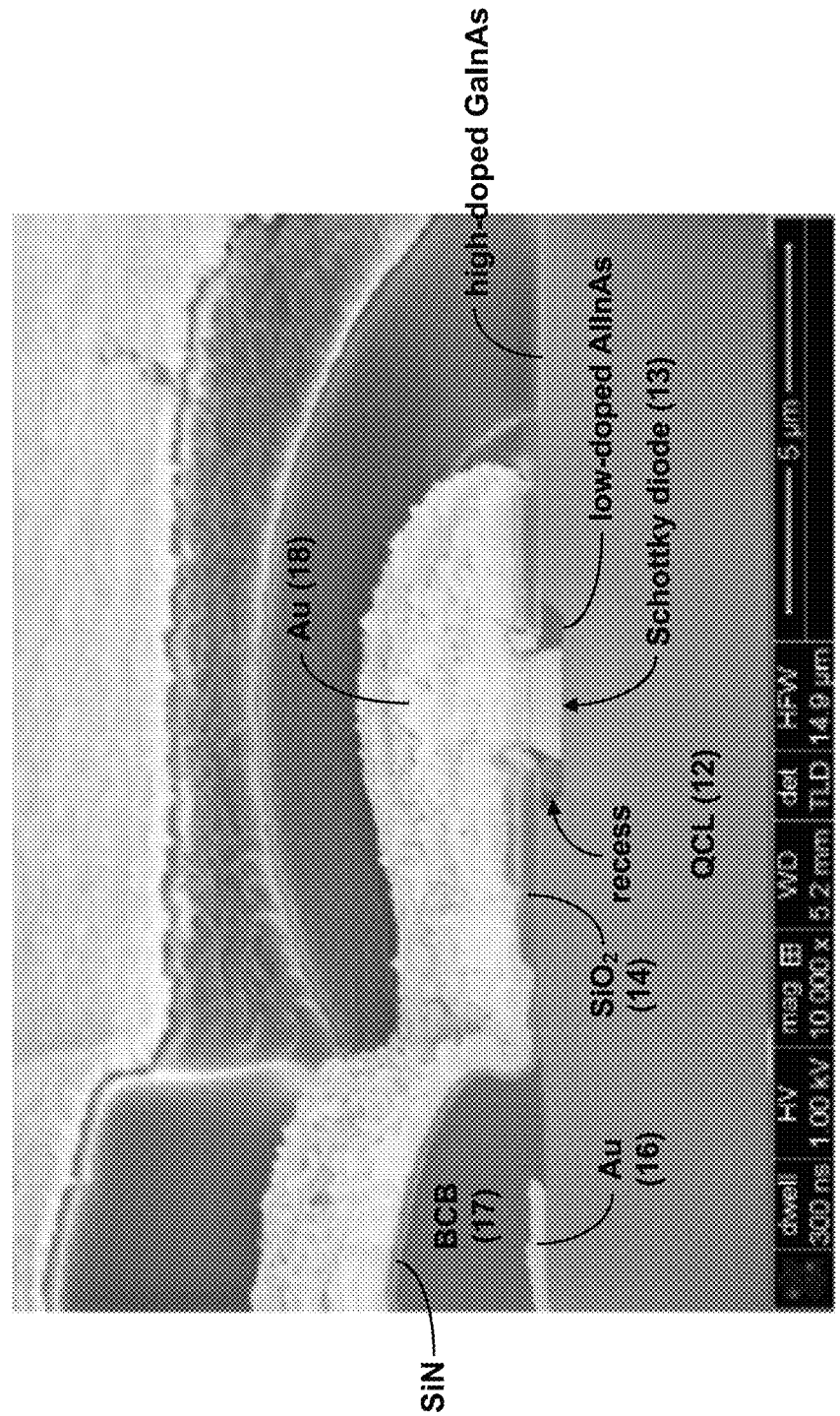
FIG. 4 is a focused-ion-beam image of cross section through a 2 μm diameter diode integrated into an 8 μm wavelength QCL.

As described above, the standard IR laser waveguide has a highly doped top cladding layer such that a top contact metal would make an ohmic contact to the semiconductor and would also keep the laser mode away from the metal. Therefore, in order to create a Schottky contact where the laser mode is non-negligible, a 3000 Å deep hole was etched through the highly doped GaInAs top layers to reach the underlying AlInAs layer with a doping of 2E17. A focused ion beam image of a cross section through a 2 µm diameter diode is shown in FIG. 4. The etch undercuts the SiO$_2$ mask, but stops on the low-doped AlInAs layer. The undercut ensures that the metal does not short to the sidewalls of the outer GaInAs layer and the selective etch that stops on the AlInAs results in a metal contact area that is flat and smooth. The undercut does mean that the series resistance of the diode is increased since the current has to flow laterally for some distance through the low-doped AlInAs before reaching the high-doped GaInAs.

Microwave Feed Design

A transmission feed line is required to bring the down-converted intermediate frequency output signal from the integrated Schottky diode to a bond pad at the edge of the die. In contrast to THz lasers, the substrate for IR QCLs is conducting which prevents placement of the RF waveguide in direct contact with the substrate. Even a RF waveguide suspended above a doped substrate would lead to large losses. Therefore, in the case of an IR transceiver, a metal ground plane was used to isolate the signal from the substrate and minimize the loss of the transmission line. Fortunately, the top metal contact to IR QCLs commonly covers most the substrate area of a laser die. However, suspending the RF waveguide over this metal ground plane, in turn, restricts the dimensions of the transmission line to limit the capacitance of the device. Additionally, it creates a parasitic metal-insulator-metal capacitor between the 100 μm-square bond pad and the underlying ground plane, which may limit the bandwidth of the trace.

A thick dielectric between the ground plane and RF waveguide can be used to reduce the capacitance. Therefore, 5 μm-thick benzocyclobutene (BCB) was used as the dielectric for the microwave line, as shown in FIGS. 2(a) and 4. This material has both a low dielectric constant and very low dielectric loss at RF and microwave frequencies. For simulation purposes, values of $\epsilon_r=2.6$ and $\delta_d=0.0$ were used for the BCB. For reference, a 50Ω microstrip transmission line on this material will have a width of 11 μm, so coplanar lines would be narrower than that. Open or shorted stubs can be used for matching the diode impedance to the transmission line. However, this can limit the bandwidth of the circuit. Thus, the impedance is preferably kept at 50Ω up to the diode to minimize reflections during the measurement. To match the capacitance of the bond pad, a 400 μm long coplanar transmission line with a trace width of 2 μm and a gap of 7 μm was used. The characteristic impedance of this line is expected to be 110Ω, and the equivalent inductance of the trace is 0.2 nH. This inductance, combined with the approximately 0.25 nH inductance of the bond wires, matches the bond pad to 50Ω.

Figure 5:
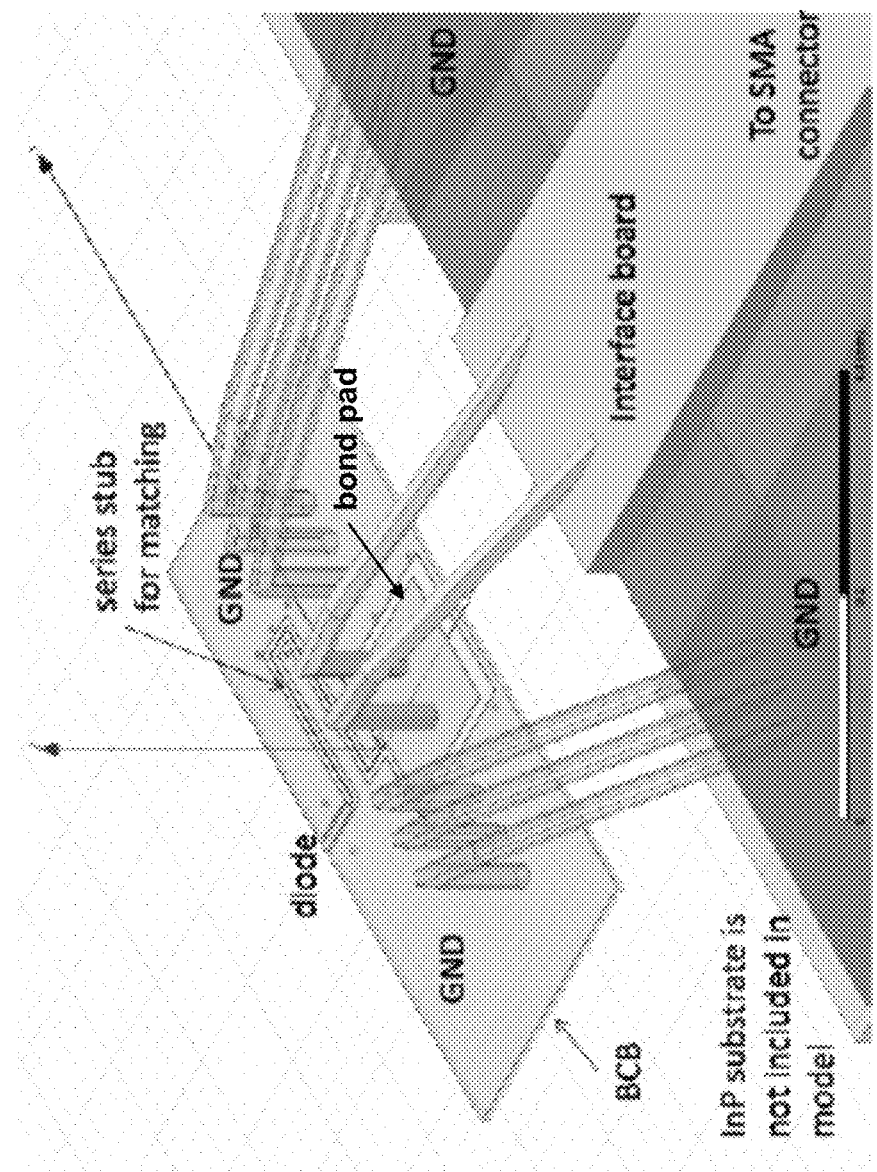
FIG. 5 is a three-dimensional HFSS model used for simulation of the RF waveguide from the diode to the interface board. The InP substrate is not included because it is shielded from the trace by the metal ground plane.

An ANSYS HFSS model of the feed from the diode to an MIR interface board is shown in FIG. 5. The series inductive matching segment is folded in a serpentine pattern to reduce the die size in the x-direction. The simulated return loss was better than 20 dB through at least 20 GHz, showing good match, and the insertion loss was <0.4 dB through 20 GHz.

Quantum Cascade Laser Characterization

Figure 6B:
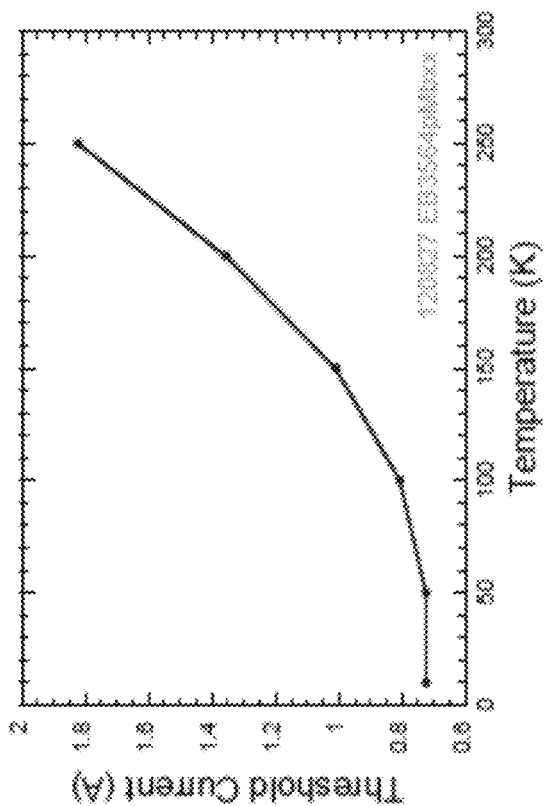
FIG. 6(b) is a graph of threshold current for the exemplary laser as a function of temperature.
Figure 6A:
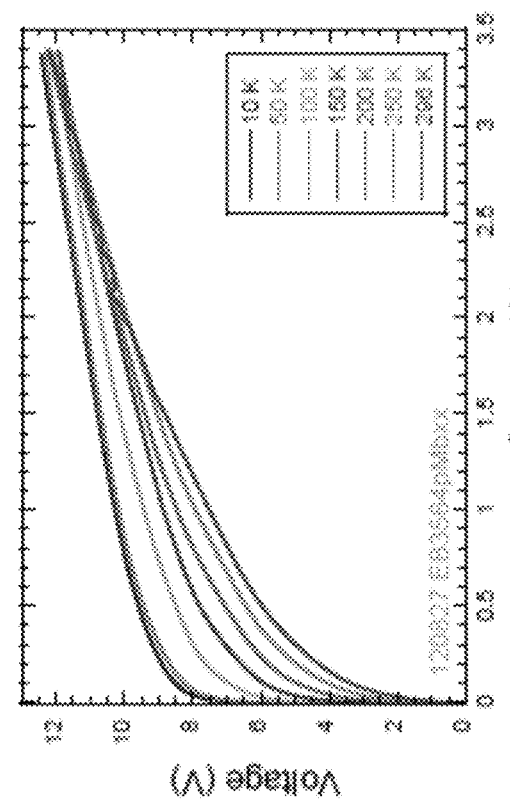
FIG. 6(a) shows an I-V graph an exemplary 2-mm long laser.
Figure 7:
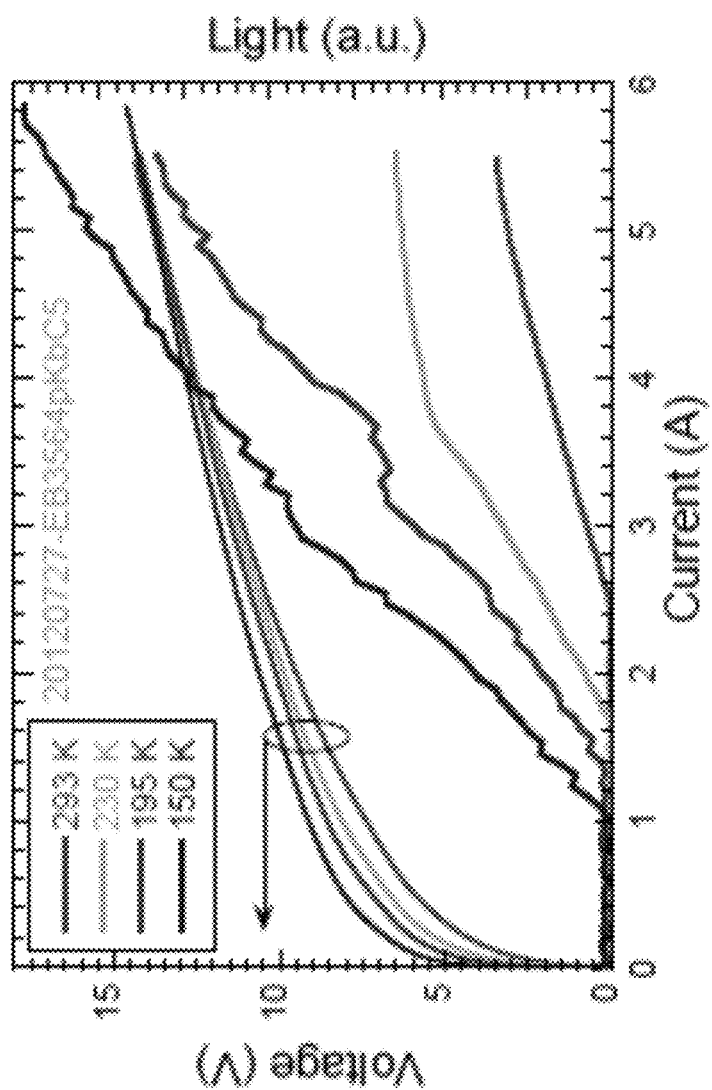
FIG. 7 is an L-I-V graph for another 2-mm long laser that does not have an embedded diode.
Figure 8:
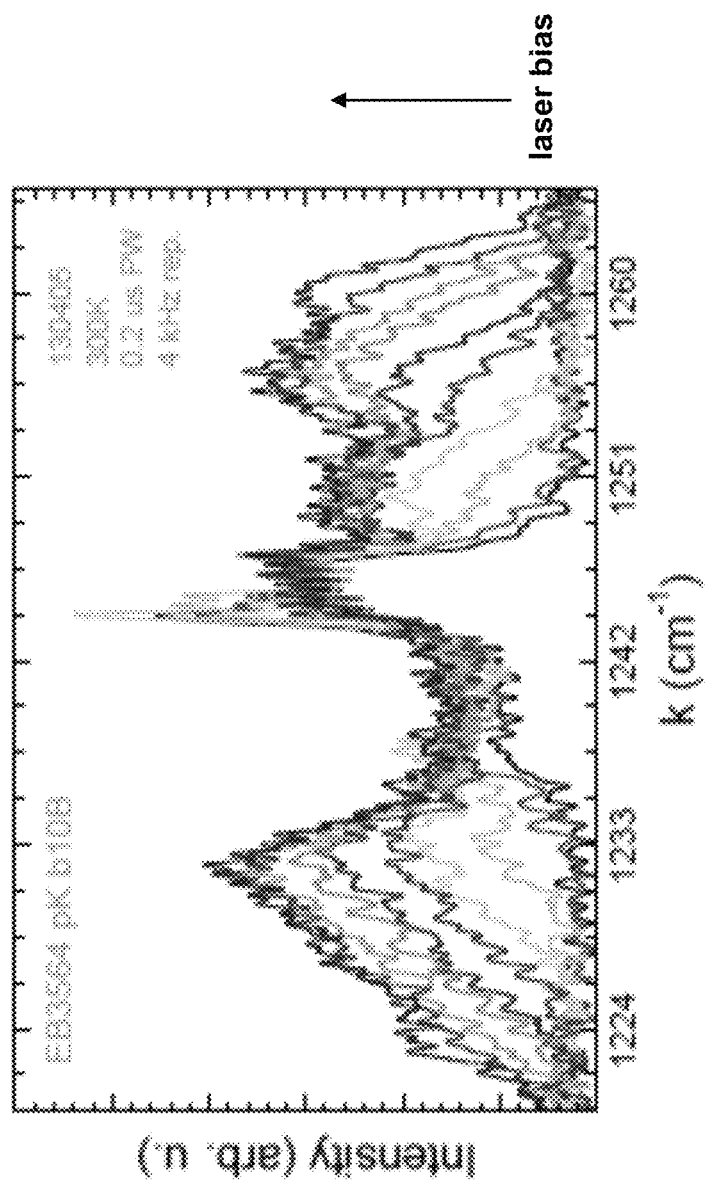
FIG. 8 is a graph of the multi-mode pulsed laser spectra as measured with FTIR for the laser without an embedded diode at 300 K. The different curves represent different laser biases ramping from low to high.

The laser current-voltage I-V versus temperature for an exemplary 2 mm long laser is shown in FIG. 6(a). This 2 mm long laser has a low threshold current (see FIG. 6(b)). FIG. 7 shows the light-current-voltage (L-I-V) characteristic for another sample laser that did not have an integrated diode. Its threshold is very similar to laser shown in FIG. 6(b). Since a goal was to observe mixing of multiple laser modes by the embedded diode, the laser has to run on more than one longitudinal mode. By using a long Fabry-Perot cavity this is essentially guaranteed. As shown in FIG. 8, the spectra of the radiation emitted by one facet of the laser shown in FIG. 7 (acquired with a Fourier Transform Infrared (FTIR) spectrometer) clearly show multi-longitudinal mode operation. The peak wavelength of the laser corresponding to the 1244 $cm^{-1}$ is 8.04 μm. The different curves represent different laser currents in ramping from 3.8 A to 4.6 A with roughly 0.09 A steps.

Schottky Diode Characterization

To ensure the diodes behaved properly, a set of isolated test diodes with diameters ranging from 1 μm to 200 μm was fabricated on each chip. The typical diode performance had ideality factors close to 1. The I-Vs for different size diodes are shown in FIG. 9(a). The 1 μm diameter diodes do not conduct. The current for the 1 μm diode essentially reflects the noise floor for the measurement ($\sim 10^{-13}$ A). All the diodes 2 μm or larger in diameter tended to behave as expected.

The ideality factors from the I-Vs were extracted by dividing 16.85 by the slope on the log-linear plot of the I-V in the exponential region. Series resistances were extracted by measuring the deviation from a straight line at high currents. To determine the barrier height, the currents were normalized by area to determine a current density for each diode. The intercept is between $1.5 \times 10^{-5}$ $A/cm^2$ and $2.5 \times 10^{-5}$ $A/cm^2$, as shown in FIG. 9(b). Assuming that the Richardson constant for InAlAs is 14.4, that the temperature was 300K, and using kT/q=25.8 meV, a Schottky barrier height of 640+/−10 meV was calculated. See R. Sung and M. B. Das, *IEEE Trans. Electron Dev.* 42(1), 188 (1995). The room temperature values of the ideality factor, series resistance and barrier height for the I-V's shown in FIG. 9(a) are given in Table 3.

TABLE 3

Room temperature DC diode properties

| Diameter μm | Slope | Ideality Factor | Resistance (Ω) | Barrier Height |
|---|---|---|---|---|
| 200 | 15.7 | 1.07 | 12 | 640 meV ± |
| 100 | 14.9 | 1.13 | 15 | 10 meV |
| 50 | 15.7 | 1.07 | 44 | |
| 25 | 15.4 | 1.09 | 68 | |
| 5 | 15.4 | 1.09 | 240* | |
| 3 | 15.2 | 1.11 | 100 | |
| 2 | 15.2 | 1.11 | 130 | |
| 1 | — | — | — | — |

Mixer Measurements

Figure 10:
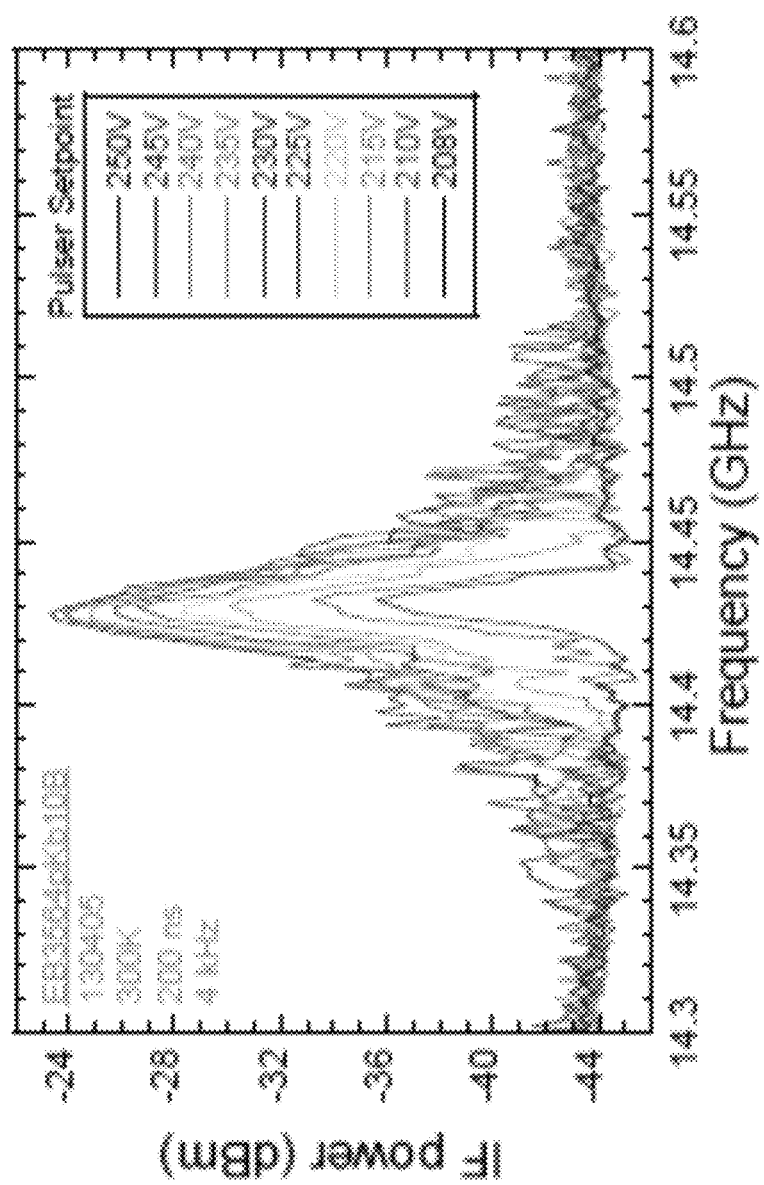
FIG. 10 shows the RF spectra generated by mixing the internal laser modes in the integrated diode on a sample laser operating at room temperature. The different curves represent the same laser biases shown in FIG. 8. The laser current corresponding to the pulser set point (x(V)) is given by I(A)=0.185x+0.028.
Figure 11A:
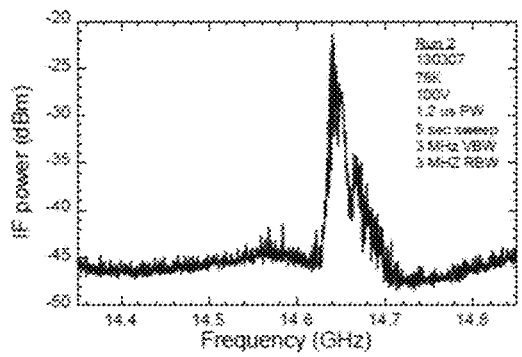
FIGS. 11(a)-(e) show RF mixing spectra for laser current pulse widths ranging from 150 ns to 1200 ns.
Figure 11B:
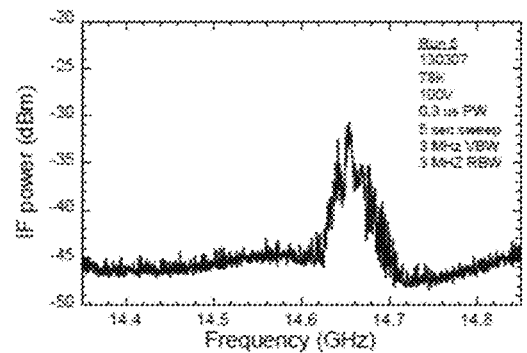
Figure 11C:
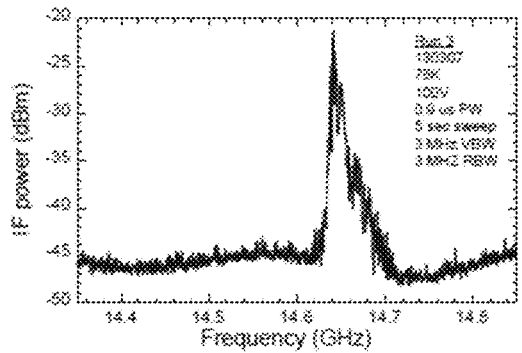
Figure 11D:
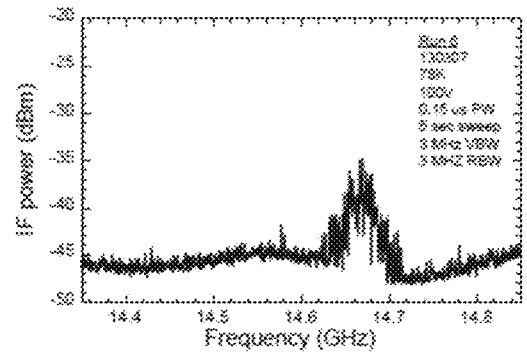
Figure 11E:
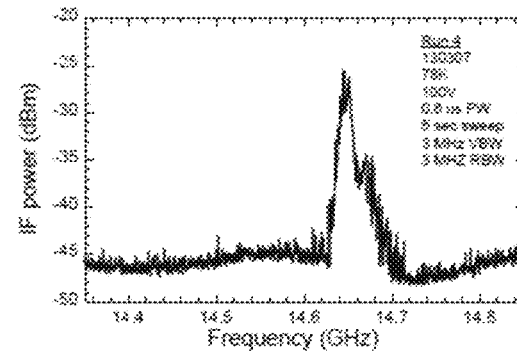

A simple measurement with the IRT looked for the mixing between two or more laser modes. To detect mixing, it is needed to drive current in the laser until it is running on more than one longitudinal mode and then look for a mixing term at the round trip frequency of the laser cavity (around 14 GHz) with a spectrum analyzer. The IR lasers tested operated in a pulsed mode. In continuous wave THz transceivers the FTIR spectra showed multiple laser lines, all separated from their nearest neighbors by 13 GHz, corresponding to the free spectral range of the Fabry-Perot cavity, and a mixing response in the diode was observed at this frequency. See M. C. Wanke et al.,*Nat Photonics* 4(8), 565 (2010). For the pulsed IR mixers, the FTIR spectra shown in FIG. 8 do show multiple lines, but the lines do not appear to be exactly equally spaced. A possible reason for this is due to laser chirp. However, even though the FTIR spectra is not as clear, a mixing response was seen near 14 GHz, as shown in FIG. 10, which again corresponds to the free-spectral range of the IR laser. Thus, even though the IR laser modes are mostly designed to stay away from the metal contacts, the slightly sunk diode does couple to the internal laser fields and can mix them to generate the beat frequencies corresponding to the frequency separation of the modes.

At lower temperatures, the RF mixing response broadens towards lower frequencies and grows in amplitude as the pulse length increases, as seen in FIG. 11(a)-(e). This behavior can be explained qualitatively assuming chirp. As the pulse length increases the laser will heat more and the peak should shift to lower frequencies. At the beginning of the pulse, the spectrum analyzer will detect a mixing signal at the high frequency end of the spectrum and therefore the highest frequency component should be the same independent of pulse width. As the pulse gets longer, the final temperature will increase and the low frequency edge of the pulse should shift to lower frequencies. If the laser temperature rose linearly, the measured amplitude might be expected to stay fixed as a function of frequency, but the rate of temperature increase should slow as the laser approaches its steady state value and therefore the amount of time that the free spectral range stays within a frequency bin on the spectrum analyzer will increase and therefore also the detected response should increase. Therefore, the diode can couple to the internal laser modes and can generate the RF power at the difference frequency between different modes. To work as a heterodyne receiver, continuous wave operation of the laser can be used or at least operation with pulses longer than the time constant to reach thermal steady-state can be used.

In summary, the internal laser fields of the IR laser can couple to the embedded Schottky diode and can mix the IR fields to generate a response at the difference frequencies between two or more laser modes, between one or more laser modes and externally applied IR radiation, between one or more laser modes and IR radiation generated by non-linear mechanisms in the laser (e.g. harmonic generation, sum-frequency generation, etc.), or between one or more laser modes and other frequencies generated by non-linear rectification in the diode. For example, an externally received infrared signal can be received by an end facet or sidewall of the laser waveguide, through a top or bottom cladding layer of the laser waveguide, or by an infrared antenna structure connected to the Schottky diode. Alternatively, the diode can rectify a single mode of the laser field to provide a DC electrical response proportional to the laser power.

Infrared Transceiver Processing

The following describes the processing steps for fabricating the exemplary IRT shown in FIG. 2(a) with a Schottky diode monolithically integrated into the IR QCL, starting with the laser structure described in Table 1. FIG. 4 is a FIB cross section image through the laser and diode in a fully completed device showing the various layers described in the process flow below.

Figure 12A:
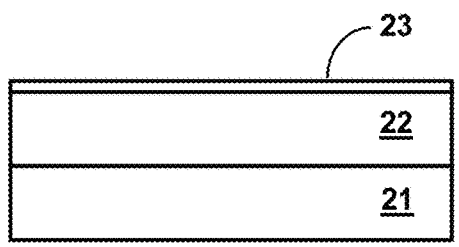
FIGS. 12(a)-(v) show the processing steps for an infrared transceiver.

As shown in FIG. 12(a), the first step in the process is to deposit 3000 Å of plasma-enhanced chemical vapor deposition (PECVD) $SiO_2$ 23 on the top layer of the QCL layer structure 22 on a substrate 21 in a PECVD chamber.

Figure 12E:
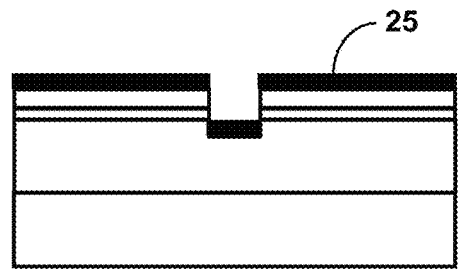
Figure 12B:
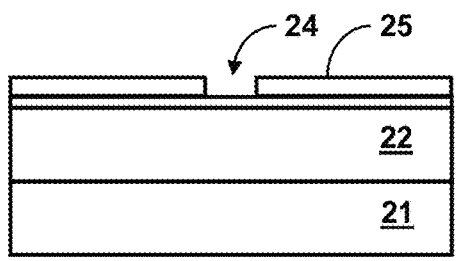

Next, as shown in FIG. 12(b), a window 24 is defined in photoresist 25 for subsequently creating an opening in the $SiO_2$ 23 where the Schottky diode 13 is to be placed.

Figure 12F:
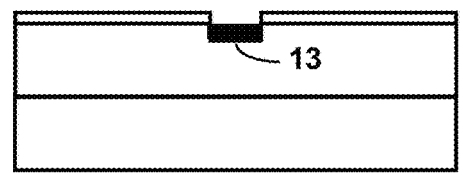
Figure 12C:
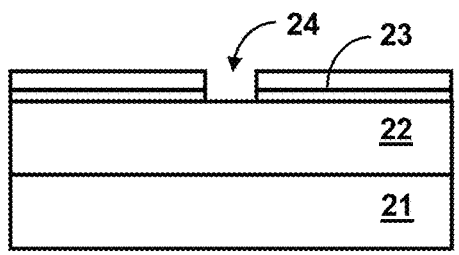

Next, as shown in FIG. 12(c), the exposed $SiO_2$ 23 in the opening 24 is etched down to the top highly doped epi-layer of the QCL structure 22 using reactive ion etching (RIE). Any fluorocarbon residue is removed from the bottom of the etched circle using a 1-min $O_2$ plasma.

Figure 12G:
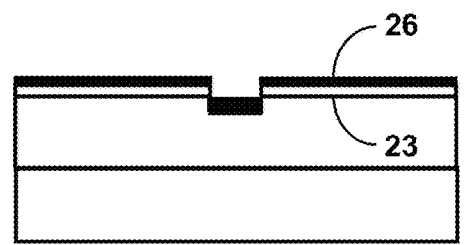
Figure 12D:
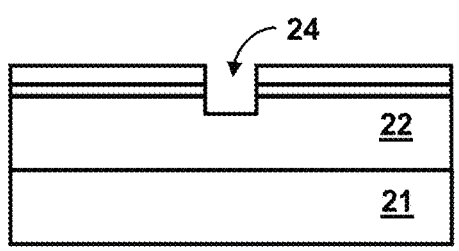

Next, as shown in FIG. 12(d), citric acid:$H_2O_2$ 2:1 (1 g anhydrous citric acid per ml DI) is used to selectively etch in the opening 24 down 3500 Å deep through the top, highly-doped epi-layer to stop on and expose the low-doped AlInAs layer of the QCL structure 22.

Next, as shown in FIG. 12(e), TiAu (400 Å Ti, 5000 Å Au) 25 is blanket deposited with e-beam evaporation.

Next, as shown in FIG. 12(f), the TiAu is removed by liftoff leaving only the Schottky diode 13 in the etched hole.

Next, as shown in FIG. 12(g), TiAu (100 Å Ti, 1000 Å Au) 26 is blanket deposited with e-beam evaporation.

Figure 12H:
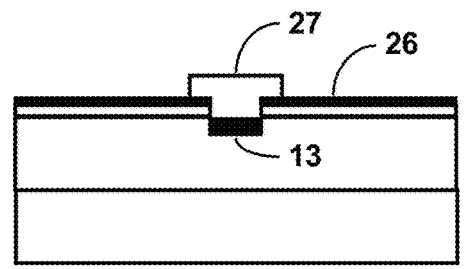

Next, as shown in FIG. 12(h), an 8 micron diameter cylinder of photoresist 27 is defined, centered over the Schottky disk 13. The photoresist 27 acts as an etch mask for the subsequent TiAu and $SiO_2$ etch steps.

Figure 12I:
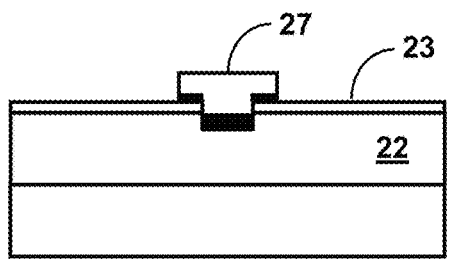

Next, as shown in FIG. 12(i), the exposed TiAu metal 26 is reactive-ion etched to expose the underlying $SiO_2$ 23.

Figure 12M:
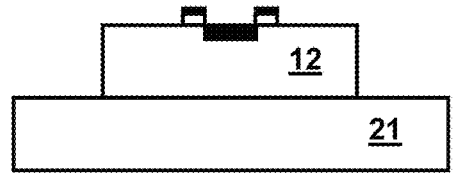
Figure 12J:
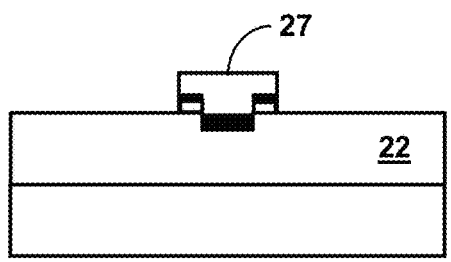

Next, as shown in FIG. 12(j), the exposed $SiO_2$ 23 is reactive-ion etched to expose the highly-doped epi-layer of the QCL 22.

Figure 12N:
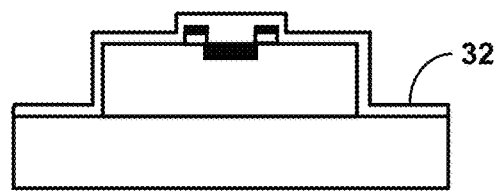
Figure 12K:
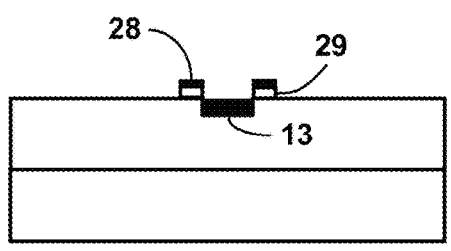

Next, as shown in FIG. 12(k), the remaining photoresist 27 is striped, leaving an 8 micron diameter stack 28 of TiAu on the remaining $SiO_2$ 29 and on top of the Schottky diode 13. The stack 28 serves as a hard etch mask to protect the underlying $SiO_2$ 29 around the Schottky disk 13 and also makes a large contact area for the Schottky diode 13 in subsequent processing steps.

Figure 12O:
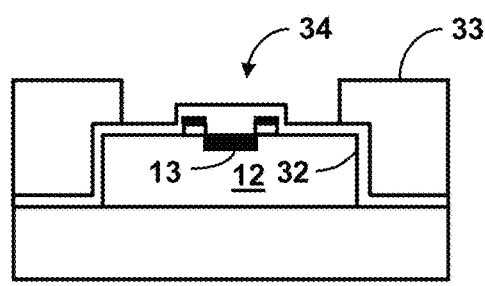
Figure 12L:
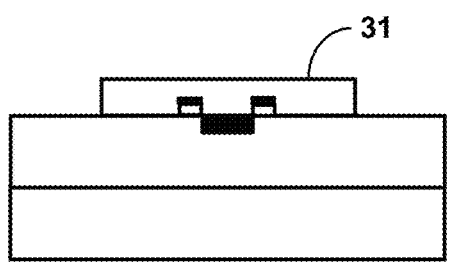

Next, as shown in FIG. 12(l), a laser mesa photoresist rectangle 31 is defined to serve as a laser waveguide etch mask.

Next, as shown in FIG. 12(m), the QCL mesa structure 12 is selectively wet etched approximately 7.0 microns deep using $H_3PO_4$:$H_2O_2$ (5:1) which stops on the InP substrate 21. The remaining photoresist 31 is removed.

Next, as shown in FIG. 12(n), 3000 Å of PECVD $SiO_2$ 32 is blanket deposited.

Next, as shown in FIG. 12(o), photoresist 33 is spin coated and a pattern 34 is defined that is used to remove the $SiO_2$ layer 32 on top of the laser stripe 12 and Schottky diode 13 to enable making contact to top of the laser and the Schottky diode. The resist 33 is 7 µm thick which helps provide uniform coverage over the topography of the tall laser stripe.

Figure 12P:
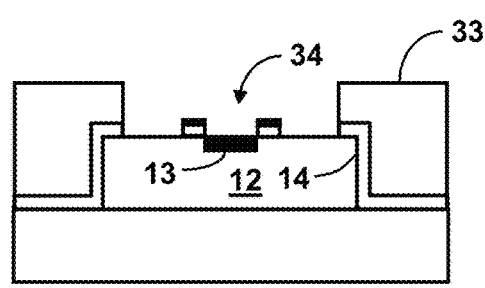

Next, as shown in FIG. 12(p), the exposed $SiO_2$ on top of the laser stripe 12 and diode 13 is reactive-ion etched, leaving the $SiO_2$ insulating layer 14 on the laser sidewalls and the area around the laser.

Figure 12Q:
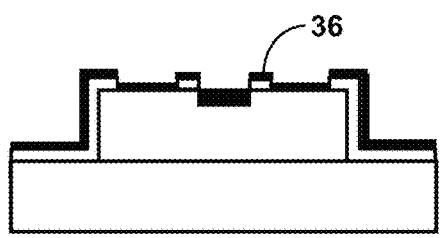

Next, as shown in FIG. 12(q), photoresist 33 is striped and TiAu (100 Å Ti, 1000 Å Au) 36 is blanket deposited with a sputtering system. The metal is used as seed layer for subsequent plating.

Figure 12T:
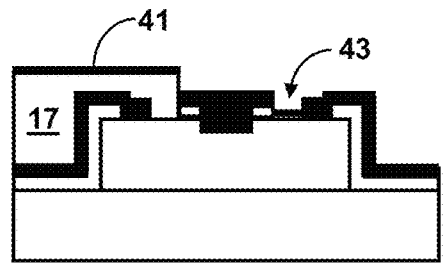
Figure 12R:
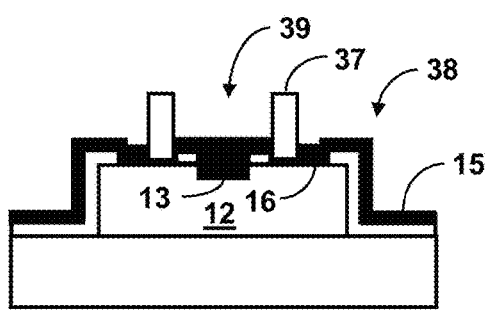

Next, as shown in FIG. 12(r), photoresist 37 (6 µm thick positive tone) is spin coated and openings 38 and 39 are defined that are used for Au plating of the top laser contacts 16 and 15 and Schottky diode contact 13. 0.5 microns thick Au is then plated to provide better heat transfer from laser structure.

Figure 12U:
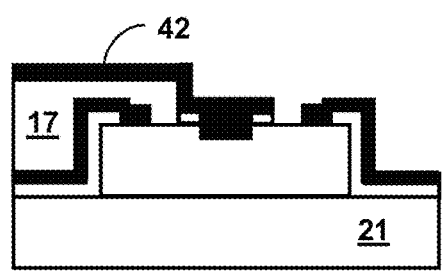
Figure 12S:
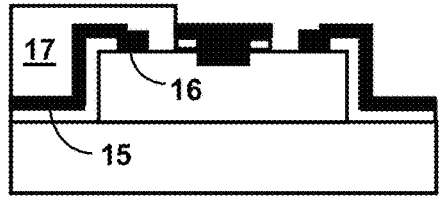

Next, as shown in FIG. 12(s), after removing the photoresist 37, the TiAu seed metal is wet etched in KII solution, followed by 100:1 DI:HF. This removes the short created by the seed metal between the diode 13 and ground plane 15. BCB (akin to negative tone photoresist) is pin coated and photo defined to create the insulating layer 17 used to support the RF waveguide above the ground plane 15 defined by the laser top contact 16. After patterning, the BCB is cured at 250° C. for 2 hours.

1000 Å of PECVD $Si_3N_4$ (not shown) is deposited. Photoresist is spin coated and to photo define areas to mask the underlying areas of nitride. The exposed $Si_3N_4$ is reactive-ion etched. The nitride is etched so that it only covers the area over the BCB and the area surrounding the diode. The remaining nitride acts as an adhesion layer for the RF feed structure and helps ensure the RF feedline does not short to the ground plane around the diode.

Next, as shown in FIG. 12(t), after stripping the resist, TiAu (100 Å Ti, 1000 Å Au) 41 is blanket deposited with a sputtering system. The metal is again used as seed layer for subsequent plating and connects the RF waveguide ground to the laser top contact. Photoresist (6 μm thick, not shown) is spin coated and openings are defined to plate the RF waveguide, Schottky contact and a second layer on the laser top contact.

Next, as shown in FIG. 12(u), 0.5 microns thick Au 42 is plated. The remaining photoresist is removed and the exposed TiAu seed metal 43 is wet etched in KII solution, followed by 100:1 DI:HF. This removes the unplated areas of the seed metal that short the diode and RF feed line to the ground plane.

Figure 12V:
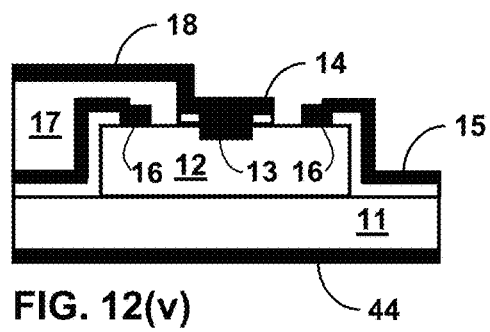

Finally, as shown in FIG. 12(v), the backside of the substrate 21 is lapped and polished to reduce the substrate thickness to 300 microns using a polisher. The backside of the thinned substrate 11 is cleaned and TiAu (100 Å Ti, 2000 Å Au) 44 is evaporated onto the backside of the substrate 11 to make electrical contact with the bottom of the laser 12, and to allow the laser to be soldered to a laser mount.

The present invention has been described as a monolithically integrated infrared transceiver. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A monolithically integrated infrared transceiver, comprising:
   an infrared semiconductor laser, comprising
     a bottom cladding layer,
     a layered semiconductor heterostructure active region, comprising two or more different semiconductor layers, on the bottom cladding layer, and
     a top cladding layer, comprising a plurality of doped semiconductor layers, on the active region, thereby providing a laser waveguide between the top and bottom cladding layers for confinement of a mode field of the infrared semiconductor laser therein; and
   a Schottky diode, comprising a rectifying metal contact recessed into the top cladding layer such that the mode field couples to the depletion region of the diode.

2. The infrared transceiver of claim 1, wherein the mode field comprises at least one mode having a frequency of greater than 10 THz (less than 30 μm wavelength).

3. The infrared transceiver of claim 2, wherein the at least one mode has a frequency between 10 and 300 THz (between 30 and 1 μm wavelength).

4. The infrared transceiver of claim 1, wherein mixing occurs between at least two modes of the mode field to provide an intermediate frequency output signal at the diode.

5. The infrared transceiver of claim 4, wherein the at least two modes comprises two or more laser modes, one or more laser modes and externally received infrared radiation, one or more laser modes and infrared radiation generated by non-linear mechanisms in the laser, or one or more laser modes and other frequencies generated by non-linear rectification in the Schottky diode.

6. The infrared transceiver of claim 5, wherein the externally received infrared signal is received by an end facet or sidewall of the laser waveguide, or through a top or bottom cladding layer of the laser waveguide.

7. The infrared transceiver of claim 5, wherein the externally received infrared signal is received by an infrared antenna structure connected to the Schottky diode.

8. The infrared transceiver of claim 1, wherein the diode rectifies a single laser mode of the mode field to provide a DC electrical response proportional to the laser power.

9. The infrared transceiver of claim 1, wherein the infrared semiconductor laser comprises a quantum cascade laser.

10. The infrared transceiver of claim 1, wherein the infrared semiconductor laser comprises a ring geometry laser, a photonic crystal later, or a nano-laser.

11. The infrared transceiver of claim 1, wherein the layered semiconductor heterostructure active region comprises GaAs, AlAs, InAs, GaN, AlN, InN, GaSb, AlSb, InSb or alloys thereof.

12. The infrared transceiver of claim 1, wherein the doping of the top-most doped semiconductor layers of the top cladding layer is tailored to bring the mode field of the infrared semiconductor laser close to the rectifying metal contact of the Schottky diode.

13. The infrared transceiver of claim 12, wherein the top-most doped semiconductor layers have doping of less than $1 \times 10^{19}$ cm$^{-3}$.

14. The infrared transceiver of claim 1, wherein the rectifying metal contact is recessed into the top cladding layer to contact a semiconductor layer having a doping of less than $1 \times 10^{18}$ cm$^{-3}$.

15. The infrared transceiver of claim 1, wherein the rectifying metal contact comprises titanium.

16. The infrared transceiver of claim 1, wherein the rectifying metal contact has a cross-sectional dimension of greater than 1 micron.

17. The infrared transceiver of claim 1, wherein the laser waveguide comprises a ridge structure.

18. The infrared transceiver of claim 17, further comprising at least one additional Schottky diode to form an array of mixers on the top of the ridge structure.

19. The infrared transceiver of claim 1, further comprising a coplanar RF waveguide or microstrip line on the laser waveguide.

20. The infrared transceiver of claim 1, further comprising at least one additional infrared semiconductor laser, each with at least one Schottky diode, wherein the mode field of the at least one additional infrared semiconductor laser couples to the depletion region of the at least one Schottky diode to provide an array of infrared transceivers.

* * * * *